(12) United States Patent
Ueno et al.

(10) Patent No.: US 6,841,274 B2
(45) Date of Patent: Jan. 11, 2005

(54) GAN SINGLE-CRYSTAL SUBSTRATE, NITRIDE TYPE SEMICONDUCTOR EPITAXIAL SUBSTRATE, NITRIDE TYPE SEMICONDUCTOR DEVICE, AND METHODS OF MAKING THE SAME

(75) Inventors: Masaki Ueno, Itami (JP); Eiryo Takasuka, Itami (JP); Soo-Jin Chua, Singapore (SG); Peng Chen, Singapore (SG)

(73) Assignees: Sumitomo Electric Industries, Ltd., Osaka (JP); Institute of Materials Research & Engineering (SG)

( * ) Notice: Subject to any disclaimer, the term of this patent is extended or adjusted under 35 U.S.C. 154(b) by 0 days.

(21) Appl. No.: 10/431,431

(22) Filed: May 8, 2003

(65) Prior Publication Data

US 2003/0209185 A1 Nov. 13, 2003

(30) Foreign Application Priority Data

May 13, 2002  (JP) ..................................... P2002-137722

(51) Int. Cl.⁷ ............................. B32B 9/04; C30B 29/38
(52) U.S. Cl. ....................... 428/698; 428/697; 117/952; 117/953
(58) Field of Search ................................ 428/698, 697; 117/952, 953

(56) References Cited

U.S. PATENT DOCUMENTS

| | | | | |
|---|---|---|---|---|
| 5,679,152 A | * | 10/1997 | Tischler et al. | ................ 117/97 |
| 6,211,089 B1 | * | 4/2001 | Kim et al. | ................... 438/691 |
| 6,372,041 B1 | * | 4/2002 | Cho et al. | ....................... 117/84 |
| 6,488,767 B1 | * | 12/2002 | Xu et al. | ......................... 117/2 |
| 6,501,154 B2 | * | 12/2002 | Morita et al. | ............... 257/628 |
| 6,554,896 B1 | * | 4/2003 | Asai et al. | ..................... 117/89 |
| 6,592,663 B1 | * | 7/2003 | Sarayama et al. | ............ 117/68 |
| 6,648,966 B2 | * | 11/2003 | Maruska et al. | ............ 117/101 |

FOREIGN PATENT DOCUMENTS

| | | | |
|---|---|---|---|
| EP | | 810674 A2 | * 12/1997 |
| WO | WO 99/23693 | | 5/1999 |

* cited by examiner

Primary Examiner—Stephen Stein
(74) Attorney, Agent, or Firm—McDermott Will & Emery LLP

(57) ABSTRACT

The GaN single-crystal substrate 11 in accordance with the present invention has a polished surface subjected to heat treatment for at least 10 minutes at a substrate temperature of at least 1020° C. in a mixed gas atmosphere containing at least an $NH_3$ gas. As a consequence, an atomic rearrangement is effected in the surface of the substrate 11 in which a large number of minute defects are formed by polishing, so as to flatten the surface of the substrate 11. Therefore, the surface of an epitaxial layer 12 formed on the substrate 11 can be made flat.

3 Claims, 5 Drawing Sheets

GaN SUBSTRATE

GaN SUBSTRATE

GaN SUBSTRATE

GAN SINGLE-CRYSTAL SUBSTRATE, NITRIDE TYPE SEMICONDUCTOR EPITAXIAL SUBSTRATE, NITRIDE TYPE SEMICONDUCTOR DEVICE, AND METHODS OF MAKING THE SAME

BACKGROUND OF THE INVENTION

1. Field of the Invention

The present invention relates to a GaN single-crystal substrate, a nitride type semiconductor epitaxial substrate, a nitride type semiconductor device, and methods of making them for use in light-emitting devices and the like.

2. Related Background Art

Attention has recently been given to light-emitting devices using nitride type compound semiconductors, since they can emit light having a short wavelength in a region from ultraviolet to blue-green. These devices such as light-emitting diodes and laser diodes are prospective as illumination and display apparatus, or light sources for next-generation DVD. As a substrate for use in these light-emitting devices, a GaN single-crystal substrate having a lattice constant identical to that of a GaN layer, which is a major nitride type semiconductor layer, is preferably employed. However, it has conventionally been considered difficult to make a GaN single-crystal substrate.

Therefore, sapphire substrates, which have a lattice constant approximating that of GaN while being chemically stable, have normally been in use. OMVPE is usually used as a method of epitaxially growing a GaN substrate on such a sapphire substrate. In the OMVPE, after the surface of the sapphire substrate is cleaned while the substrate temperature is held at about 1050° C. in an $H_2$ gas atmosphere, a buffer layer of GaN or AlN is grown at a substrate temperature of about 450 to 600° C., and then a GaN layer is grown at a high temperature of at least 1000° C.

However, the use of a sapphire substrate is problematic in the following points: First, the lattice constant of the sapphire substrate is close but not identical to that of the GaN layer, whereby a number of defects such as dislocations caused by lattice mismatching are introduced at the interface between the sapphire substrate and GaN layer. These defects extend in the growth direction, so as to appear as a number of through defects on the epitaxial layer surface, and remarkably deteriorate characteristics and lives of light-emitting devices such as laser diodes. Also, since the thermal expansion coefficient of the sapphire substrate and that of the GaN layer greatly differ from each other, the eptaxially grown substrate may warp greatly. Further, since the sapphire substrate has no cleavage property, it is very hard to make a laser diode using a cleavage plane as a reflecting surface.

In view of such circumstances, a single-crystal GaN substrate suitable for forming a nitride type compound semiconductor layer has been realized (International Application Laid-Open No. WO99/23693). In this method, a mask having a striped or circular form is formed on a GaAs substrate, a GaN layer is grown thereon in a vapor phase, and then the GaAs substrate is removed therefrom, whereby a GaN substrate can be obtained. Also, this method can mass-produce GaN substrates by further growing a GaN layer on the GaN substrate so as to prepare an ingot and then cutting out GaN substrates from the ingot. Namely, this new method has made it possible to mass-produce GaN single-crystal substrates.

SUMMARY OF THE INVENTION

However, the conventional GaN substrate mentioned above may be problematic as follows: Namely, while it is necessary for the surface of the prepared GaN single-crystal substrate to be mechanically polished flat in order to form an epitaxial layer thereon, the GaN single-crystal substrate is chemically so unstable that it is hard to polish by chemical mechanical polishing (CMP) which is used for other semiconductor substrates. Therefore, it is difficult for the mechanically polished substrate to attain a flatness suitable for epitaxial growth, whereby the substrate surface after typical mechanical polishing has an Rms (root-mean-square roughness) of about 1.0 nm. When an epitaxial layer is formed on a substrate having such a rough surface, three-dimensional growth occurs due to the random nucleus generation in uneven parts, which makes it difficult to yield a flat surface. Also, when grown nuclei generated are combined together in such a growth mode, crystal defects such as dislocations are likely to occur due to directional shifts existing among the nuclei, which deteriorates crystallinity. Namely, for making a semiconductor apparatus having a better quality on a GaN single-crystal substrate, it is necessary to eliminate the defects (e.g., damages and distortions) occurring due to the surface processing.

For solving the problems mentioned above, it is an object of the present invention to provide a GaN single-crystal substrate, a nitride type semiconductor epitaxial substrate, and a nitride type semiconductor device, each having a flattened surface, and methods of making them.

The present invention provides a GaN single-crystal substrate having a polished surface flattened by heat treatment for at least 10 minutes at a substrate temperature of at least 1020° C. in a mixed gas atmosphere containing at least an $NH_3$ gas.

In this GaN single-crystal, a predetermined heat treatment process is carried out for at least 10 minutes at a substrate temperature of at least 1020° C. in an $NH_3$ gas atmosphere, so as to effect an atomic rearrangement in a substrate surface in which a large number of minute defects are formed by polishing, thereby flattening the substrate surface. Therefore, the surface of an epitaxial layer formed on the substrate can be made flat.

Also, due to the heat treatment, the surface has a root-mean-square roughness of 0.2 nm or less. When the substrate surface has a root-mean-square roughness of 0.2 nm or less, it becomes a substrate sufficiently flat for forming an epitaxial layer with a favorable quality.

The present invention provides a nitride type semiconductor epitaxial substrate comprising the above-mentioned GaN single-crystal substrate and a nitride type compound semiconductor layer epitaxially grown on the GaN single-crystal substrate.

In the nitride type semiconductor epitaxial substrate, the nitride type compound semiconductor layer is formed on the GaN single-crystal substrate subjected to a predetermined heat treatment process for at least 10 minutes at a substrate temperature of at least 1020° C. in an $NH_3$ gas atmosphere. Namely, the nitride type compound semiconductor layer is epitaxially grown on a substrate which is sufficiently flat for forming an epitaxial layer, whereby a nitride type compound semiconductor layer having a flat surface and a favorable crystallinity can be obtained. Also, the surface of a semiconductor layer laminated on the nitride type compound semiconductor layer becomes flat with a favorable crystallinity, whereby light-emitting devices and semiconductor devices such as transistors using the nitride type compound epitaxial substrate can attain higher performances and yields.

Preferably, the nitride type compound semiconductor layer comprises $Al_xGa_yIn_{1-x-y}N$ ($0 \leq x \leq 1$, $0 \leq y \leq 1$, $x+y \leq 1$).

Preferably, the nitride type compound semiconductor layer comprises GaN. In this case, it has no mismatch with respect to the substrate, whereby defects can be restrained from occurring in the interface between the substrate and epitaxial layer.

Preferably, the nitride type compound semiconductor layer epitaxially grown on the GaN single-crystal substrate has a surface with a root-mean-square roughness of 0.2 nm or less. In this case, the nitride type compound semiconductor layer can be obtained with a flat surface and a favorable crystallinity. Also, when epitaxially growing a desirable semiconductor on the nitride type compound semiconductor layer, the epitaxial growth can be carried out in a state where the laminate structure has favorable steepness and crystallinity. This can form a semiconductor layer with a flat surface.

Preferably, the nitride type compound semiconductor layer exhibits an x-ray diffraction half width of 100 seconds or less. While the x-ray diffraction half width indicates the fluctuation (mosaic property) of the crystal axis of the epitaxial layer, a nitride type compound semiconductor layer having a flat surface and a favorable crystallinity can be obtained if the half width is 100 seconds or less. Also, the semiconductor layer further laminated on the epitaxial layer attains a favorable crystallinity.

Preferably, the nitride type compound semiconductor layer has a threading dislocation density of $1 \times 10^6$ cm$^{-2}$ or less. Namely, the nitride type compound semiconductor layer having a threading dislocation density of $1 \times 10^6$ cm$^{-2}$ or less can suppress the threading dislocation density within a semiconductor layer further laminated on this nitride type compound semiconductor layer (epitaxial layer).

The present invention provides a nitride type semiconductor device, wherein an n-type cladding layer comprising $Al_xGa_{1-x}N$ (0<x<1) is laminated on the above-mentioned GaN single-crystal substrate having an n-type conductivity, an active layer is laminated on the cladding layer, a p-type cladding layer comprising $Al_xGa_{1-x}N$ (0<x<1) is laminated on the active layer, and a p-type GaN layer is laminated on the p-type cladding layer.

In this nitride type semiconductor device, cladding and active layers are laminated on the GaN single-crystal substrate having a flat surface, which yields a favorable crystallinity, whereby a laser diode device having a high light-emitting efficiency and a long life can be obtained.

The present invention provides a nitride type semiconductor device comprising the above-mentioned GaN single-crystal substrate, and a plurality of nitride type semiconductor layers laminated thereon and represented by $Al_xGa_yIn_{1-x-y}N$ (0≦x≦1, 0≦y≦1, x+y≦1).

In this nitride type semiconductor device, collector, base, and emitter layers made of nitride type semiconductor layers represented by AlGaInN, for example, are successively formed on the GaN single-crystal substrate having a flat surface, which yields a favorable crystallinity, whereby a transistor having a high current amplification factor can be obtained.

Preferably, the GaN single-crystal substrate in accordance with the present invention has a surface with a root-mean-square roughness of 0.2 nm.

When the substrate surface has a root-mean-square roughness of 0.2 nm or less, it becomes a substrate sufficiently flat for forming an epitaxial layer with a favorable quality.

The present invention provides a method of making a GaN single-crystal substrate comprising the step of subjecting a GaN single-crystal having a polished surface to heat treatment for at least 10 minutes at a substrate temperature of at least 1020° C. in a mixed gas atmosphere containing at least an NH$_3$ gas, so that the surface of the GaN single-crystal substrate has a root-mean-square roughness of 0.2 nm or less.

In this method of making a GaN single-crystal substrate, the GaN single-crystal substrate is subjected to a predetermined heat treatment process for at least 10 minutes at a substrate temperature of at least 1020° C. in an NH$_3$ gas atmosphere. This effects an atomic rearrangement in a substrate surface in which a large number of minute defects are formed by polishing, thereby flattening the substrate surface. Therefore, the surface of an epitaxial layer formed on the substrate can be made flat. When a single-crystal layer of a kind different from that of such a flat epitaxial surface is grown thereon, so as to form a heterojunction, the interface of junction becomes flat, whereby a device formed by such a junction yields characteristics higher than those of a device having no flat interface junction.

Preferably, the mixed gas contains an H$_2$ gas. In this case, when the H$_2$ gas occurring upon the decomposition of the NH$_3$ gas is in short, the lacking H$_2$ gas is replenished.

The present invention provides a method of making a nitride type semiconductor epitaxial substrate comprising the step of epitaxially growing a nitride type compound semiconductor layer on the GaN single-crystal substrate obtained by the above-mentioned method of making a GaN single-crystal substrate without oxidizing the surface of the GaN single-crystal substrate.

In this method of making a nitride type semiconductor epitaxial substrate, the GaN single-crystal substrate having a flat surface is not oxidized, whereby no reprocessing such as heat treatment is necessary for forming an epitaxial layer on the substrate. This can simplify the process of making an epitaxial substrate.

The nitride type compound semiconductor layer is preferably of n type. When the epitaxial layer is of n type as such, a substrate of n type can make a light-emitting device in which an n-type semiconductor, an active layer, and a p-type semiconductor are successively laminated in this order, an npn-type bipolar transistor device, and the like.

The nitride type compound semiconductor layer is preferably of p type. When the epitaxial layer is of p type as such, a substrate of p type can make a light-emitting device in which a p-type semiconductor, an active layer, and an n-type semiconductor are successively laminated in this order, a pnp-type bipolar transistor device, and the like.

Preferably, the epitaxial growth utilizes any of OMVPE (organometallic vapor phase epitaxy), HVPE (hydride vapor phase epitaxy), and MBE (molecular beam epitaxy). This can form a favorable epitaxial layer on the substrate.

Preferably, both the heat treatment of the GaN single-crystal substrate and the epitaxial growth are effected within an apparatus for carrying out the epitaxial growth. This can grow an epitaxial layer having a favorable crystallinity while keeping the substrate surface clean.

The present invention provides a method of making a nitride type semiconductor device, the method comprising the steps of laminating an n-type cladding layer comprising $Al_xGa_{1-x}N$ (0<x<1) on the GaN single-crystal having an n-type conductivity obtained by the above-mentioned method of making a GaN single-crystal substrate, laminating an active layer on the cladding layer, laminating a p-type cladding layer comprising $Al_xGa_{1-x}N$ (0<x<1) on the active layer, and laminating a p-type GaN layer on the p-type cladding layer.

In this method of making a nitride type semiconductor device, the cladding and active layers are laminated on the GaN single-crystal substrate having a flat surface, which yields a favorable crystallinity, whereby a laser diode device having a high light-emitting efficiency and a long life can be obtained.

The present invention provides a method of making a nitride type semiconductor device comprising the steps of forming a plurality of nitride type semiconductor layers represented by $Al_xGa_yIn_{1-x-y}N$ ($0 \leq x \leq 1$, $0 \leq y \leq 1$, $x+y \leq 1$) and laminated on the GaN single-crystal substrate obtained by the above-mentioned method of making a GaN single-crystal substrate.

In this method of making a nitride type semiconductor device, collector, base, and emitter layers made of nitride type semiconductor layers represented by AlGaInN, for example, are successively formed on the GaN single-crystal substrate having a flat surface, which yields a favorable crystallinity, whereas the flatness of heterojunction interface improves. As a consequence, a transistor having a high current amplification factor can be obtained.

BRIEF DESCRIPTION OF THE DRAWINGS

The present invention may be more readily described with reference to the accompanying drawings, in which.

DESCRIPTION OF THE PREFERRED EMBODIMENTS

In the following, preferred embodiments of the GaN single-crystal substrate, nitride type semiconductor epitaxial substrate, nitride type semiconductor device, and methods of making them will be explained in detail with reference to the accompanying drawings.

Figure 1:
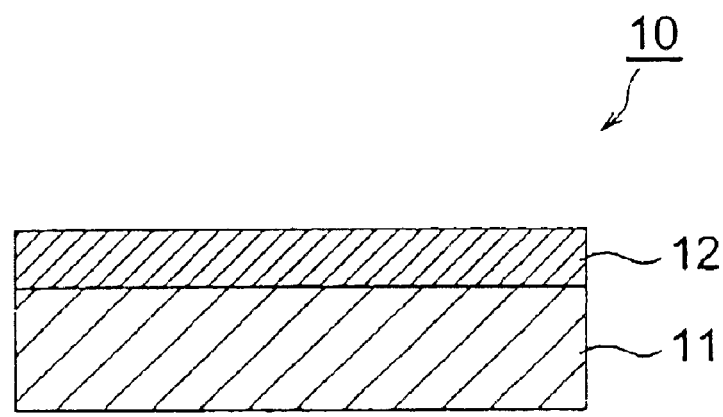
FIG. 1 is a schematic view of the epitaxial substrate in accordance with an embodiment of the present invention.

FIG. 1 is a sectional view of a nitride type semiconductor epitaxial substrate in accordance with an embodiment. This nitride type semiconductor epitaxial substrate 10 comprises a GaN single-crystal substrate 11 and a nitride type compound semiconductor layer 12 epitaxially grown thereon by OMVPE, HVPE, MBE, or the like. The nitride type semiconductor epitaxial substrate 10 is an intermediate product of a light-emitting device such as a light-emitting diode or laser diode, whereas an appropriate pn junction, preferably a double heterojunction, more preferably a quantum well structure, is formed thereon, and an electrode for supplying current is attached thereto, whereby the light-emitting device is accomplished.

The material for the nitride type compound semiconductor layer 12 is selected from binary to quaternary compound semiconductors expressed by $Al_xGa_yIn_{1-x-y}N$ ($0 \leq x \leq 1$, $0 \leq y \leq 1$, $x+y \leq 1$). Among them, GaN is the most preferable in that it can restrain defects from occurring in the interface between the substrate 11 and nitride type compound semiconductor layer 12, since it can homoepitaxially grow directly on the GaN single-crystal substrate 11 while exhibiting no mismatch therewith.

A process of making the GaN single-crystal substrate and nitride type semiconductor epitaxial substrate 10 will now be explained:

(A) First, the GaN single-crystal substrate 11 is made, and thus made GaN single-crystal substrate 11 is subjected to surface polishing with a polishing agent and then to liquid washing with purified water or the like (single-crystal substrate making step).

(B) Subsequently, the GaN single-crystal substrate 11 is placed in an atmosphere of a predetermined mixed gas G1 containing an $NH_3$ gas and is heated at a substrate temperature of T1 for time t1 (surface heat treatment step).

(C) Thereafter, in an overheated state at a substrate temperature of T2, a raw material G2 for the nitride type compound semiconductor layer 12 is supplied to the surface, so that the nitride type compound semiconductor layer 12 is epitaxially grown on the GaN single-crystal substrate 11 (epitaxial growth step).

They will now be explained in detail.

Figure 2:
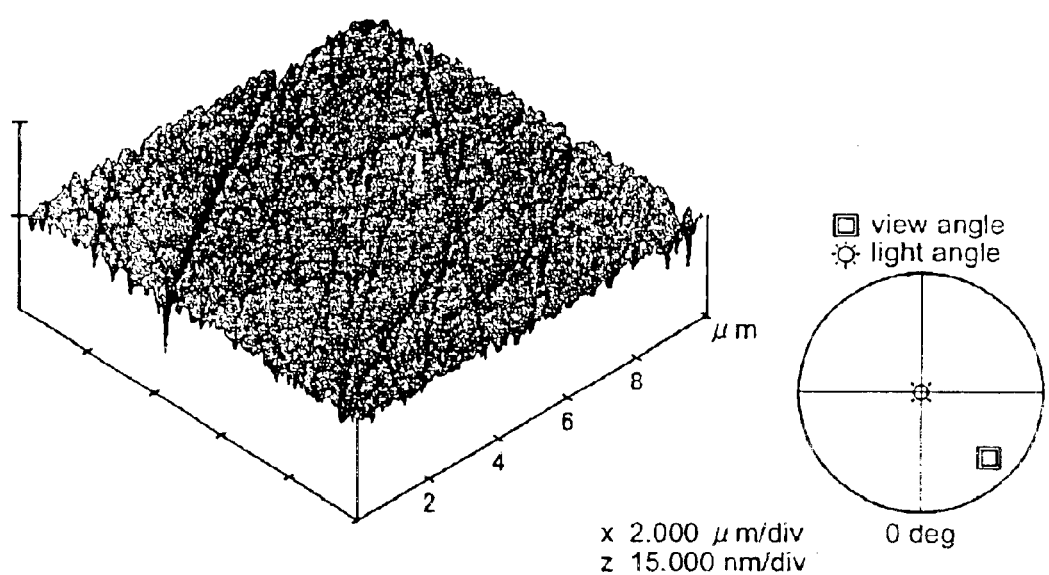
FIG. 2 is an atomic force micrograph of a GaN single-crystal substrate surface after mechanical polishing.

The manufactured GaN single-crystal substrate 11 is subjected to surface polishing with a polishing agent and then to liquid washing with purified water or the like. For the liquid washing, not only purified water but also organic solvents, acids, or alkali solutions may be used. A processed and modified layer caused by mechanical polishing damages exists on the surface of the manufactured GaN single-crystal substrate 11, but is eliminated by suitable surface processing. At this moment, the surface of the GaN single-crystal substrate 11 is flattened, so as to attain a mirror surface state. When observed under a microscope, however, fine damages formed by mechanical polishing are seen on the surface of the substrate 11. As a typical example, a surface image of the polished GaN single-crystal substrate 11 observed under an atomic force microscope is shown in FIG. 2. As depicted, a number of minute defects caused by polishing are seen on the substrate 11. The root-mean-square roughness (Rms) of this surface is about 1.0 nm.

As a consequence, when the nitride type compound semiconductor layer 12 is epitaxially grown directly on the substrate 11 having such an order of roughness, a large number of random crystal nuclei occur in areas with level differences such as damages, whereby crystals may grow three-dimensionally, which makes it difficult to obtain the nitride type compound semiconductor layer 12 having a flat surface.

The surface heat treatment step will now be explained.

Figure 3A:
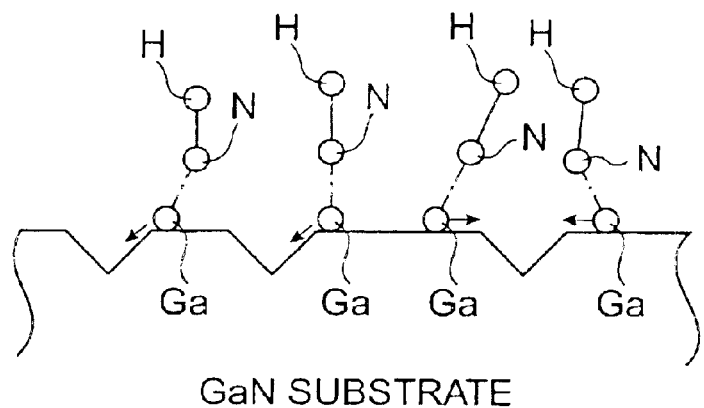
FIGS. 3A to 3C are views showing the process of flattening a substrate surface in a surface heat treatment step.

On the surface of the substrate 11, the decrease in surface roughness caused by heat treatment is assumed to progress in the following fashion. Namely, when an $NH_3$ gas is supplied onto the substrate 11 at first, $NH_3$ is decomposed into $N_2$ and $H_2$ as schematically shown in FIG. 3A. Thus formed $H_2$ reacts with GaN, thereby generating Ga atoms. These reactions are represented by the following expressions (1) and (2):

$$NH_3 \rightarrow \frac{1}{2}N_2 + \frac{3}{2}H_2 \tag{1}$$

$$GaN + \frac{1}{2}H_2 \rightarrow Ga + N \cdot H \tag{2}$$

Figure 3B:
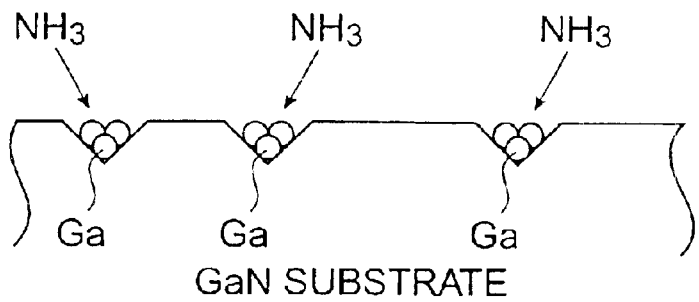
Figure 3C:
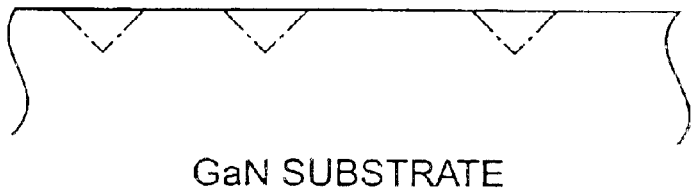

Then, the Ga atoms migrate over the surface of the substrate 11 at a high temperature, and concentrate at recesses so as to lower the surface energy. Thereafter, the Ga atoms react with $NH_3$, thereby forming GaN as shown in FIG. 3B. Such an atomic rearrangement fills the recesses in the surface of the substrate 11, thereby yielding a flat surface (see FIG. 3C). This reaction is represented by the following expression (3):

$$Ga + NH_3 \rightarrow GaN + \frac{3}{2}H_2 \qquad (3)$$

Figure 4:
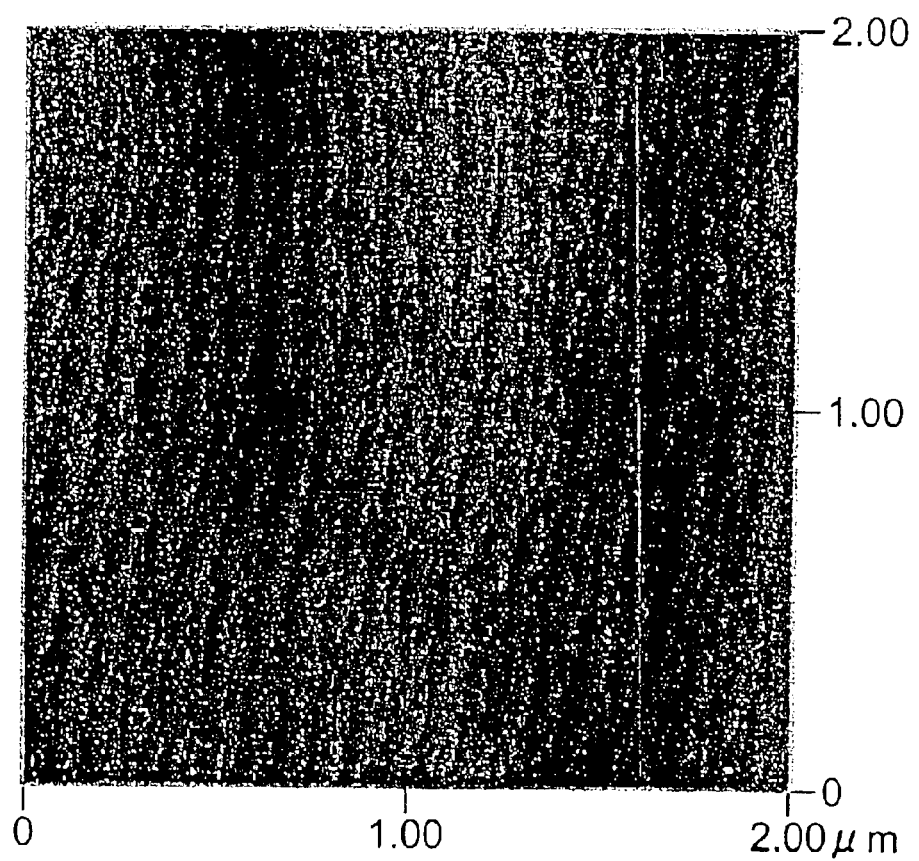
FIG. 4 is an atomic force micrograph of a GaN single-crystal substrate surface after heat treatment.

FIG. 4 shows a typical surface observation image of the GaN single-crystal substrate flattened by the foregoing heat treatment. The substrate 11 shown in FIG. 4 is a substrate heat-treated under the condition with a substrate temperature (T1) of 1020° C. and a time (t1) of 10 minutes in an atmosphere of mixed gas G1. This substrate surface exhibited an Rms of about 0.19 nm, whereas a step-and-terrace structure corresponding to one atomic layer was observed. Namely, such heat treatment allowed the surface of the GaN single-crystal substrate 11 to exhibit an Rms of 0.2 nm or less.

In the step mentioned above, it is important that Ga be decomposed in the existence of $H_2$ so as to form Ga atoms as represented by expression (2). However, the reaction rate of expression (1) is so slow that only a few % of $NH_3$ can decompose into $H_2$ and $N_2$ even at 1000° C. Such an amount of $H_2$ is insufficient for the above-mentioned surface heat treatment step to progress, whereby it is preferred that an $H_2$ gas be added to the mixed gas G1. Therefore, it is preferable for the surface heat treatment step to be carried out in an atmosphere of a mixed gas comprising $NH_3$ and $H_2$ gases.

In the surface heat treatment step, the heat treatment temperature affects the rate of each of the above-mentioned reactions, the length of Ga atom migration, the rate of Ga atom desorption, and the like. Namely, as the substrate temperature T1 is higher, the Ga migration length becomes longer, whereby Ga atoms are more likely to reach the polish-damaged parts (recesses). When the substrate temperature T1 is low, by contrast, Ga atoms react with $NH_3$ to yield GaN before reaching the polish-damaged parts, so as to generate nuclei, thus failing to flatten the surface. Assuming the surface to be flattened in such a mechanism, the inventors diligently studied temperatures suitable therefor and, as a result, have found that the substrate temperature T1 is preferably 1020° C. or higher. Therefore, in the surface heat treatment step, the substrate temperature T1 is preferably at least 1020° C.

The time required for flattening the surface of the substrate 11 is a time by which the polish-damaged parts are sufficiently filled due to the Ga atom migration and GaN generation. The inventors have found that, though depending on the polishing state of substrate 11, the surface of the substrate 11 can be flattened by heat treatment of at least 10 minutes for the surface roughness with an Rms of about 1.0 nm finished by mechanical polishing in general. Namely, the heat treatment time is preferably at least 10 minutes.

The epitaxial growth step will now be explained.

The GaN single-crystal substrate 11 having flattened its surface by the above-mentioned heat treatment is quite suitable for epitaxially growing the same kind of material as GaN, i.e., a binary to quaternary compound semiconductor expressed by $Al_xGa_yIn_{1-x-y}N$ ($0 \leq x \leq 1, 0 \leq y \leq 1, 0 \leq x+y \leq 1$), directly thereon. This is because of the fact that, as shown in FIG. 4, the terraces and steps corresponding to one atomic layer are orderly arranged on the surface of the substrate 11, so that the nitride type compound semiconductor layer 12 having a lattice constant close thereto can easily grow in a step-flow fashion.

It is also preferred that the GaN single-crystal substrate 11 be kept from being exposed to atmosphere before epitaxial growth after the heat treatment. This is because of the fact that, when exposed to the atmosphere, the surface of the substrate 11 may get oxidized or absorb organic matters and other contaminants, thereby adversely affecting the subsequent epitaxial growth. In this case, it is necessary to carry out surface treatment for purifying the surface of the substrate 11 again before the epitaxial growth, which increases the number of steps. This indicates that epitaxially growing the nitride type compound semiconductor layer 12 on the heat-treated GaN single-crystal substrate 11 can make the epitaxial substrate 10 having a high quality. The nitride type compound semiconductor layer 12 is preferably GaN in particular, since its lattice constant coincides with that of the GaN single-crystal substrate 11, so that no misfit dislocation occurs in the interface, thus yielding no fear of deteriorating the crystallinity of the nitride type compound semiconductor layer 12.

As explained in the foregoing, making the epitaxial substrate 11 exhibiting a very flat surface Rms of 0.2 nm or less as an index for the high quality of the epitaxial layer 12 is advantageous in keeping the surface flatness in its subsequent device structure growth, and is effective in improving the yields of light-emitting devices such as light-emitting diodes and laser diodes such as bipolar transistors and field-effect transistors.

Also, the above-mentioned surface heat treatment step can reduce the crystal axis fluctuation of the epitaxial layer 12. More specifically, the x-ray diffraction half width of the nitride type compound semiconductor layer 12 becomes 100 seconds or less. Namely, the surface of the epitaxial substrate 12 becomes flat, whereby the epitaxial substrate having a favorable crystallinity can be obtained.

Further, the above-mentioned surface heat treatment can suppress the threading dislocation density of the epitaxial layer 12 to $1 \times 10^6$ cm$^{-2}$ or less. This can suppress the threading dislocation density of a semiconductor layer laminated on the epitaxial layer 12.

As such, the crystallinity of the epitaxial layer 12 improves while the crystal defects on the surface decrease, whereby the crystallinity of a semiconductor layer laminated on the epitaxial layer 12 becomes favorable, and crystal defects can be restrained from occurring within the semiconductor layer. Therefore, using the epitaxial substrate 10 formed with the epitaxial layer 12 is effective in improving the characteristics, reliabilities, and yields of light-emitting devices such as light-emitting diodes and laser diodes, electronic devices such as bipolar transistors and field-effect transistors, and the like.

The conductivity of the epitaxial layer (not depicted) formed on the epitaxial substrate 10 can be controlled in conformity to structures of various conductive devices. For example, light-emitting devices such as LED and LD can be made by preparing an epitaxial substrate 10 in which an n-type GaN layer 12 is grown on an n-type single-crystal substrate 11, and then growing thereon a basic structure comprising an n-type cladding layer, an active layer, a p-type cladding layer, and a p-type contact layer. Thereafter, such steps as forming an electrode, connecting current terminals, forming a reflecting surface in the case of a laser diode, and so forth are taken as a matter of course, so as to accomplish a device.

For example, a combination of an n-type GaN substrate 11 with an n-type GaN layer 12 is suitable for an npn-type bipolar transistor device, whereas a semi-insulating GaN substrate is preferable for a field-effect transistor.

EXAMPLES

A growth method employed for epitaxial growth can be selected from OMVPE, HVPE, MBE, and the like. When any of them is chosen, the GaN single-crystal substrate 11 is heat-treated within an apparatus for growth and then, without taking out the GaN single-crystal substrate 11, the nitride type compound semiconductor layer 12 is epitaxially grown thereon, whereby the surface of the substrate 11 is kept from being contaminated. Therefore, the surface processing step required when the surface is oxidized or contaminated is unnecessary, whereby a high-quality epitaxial substrate can be made easily.

Figure 5:
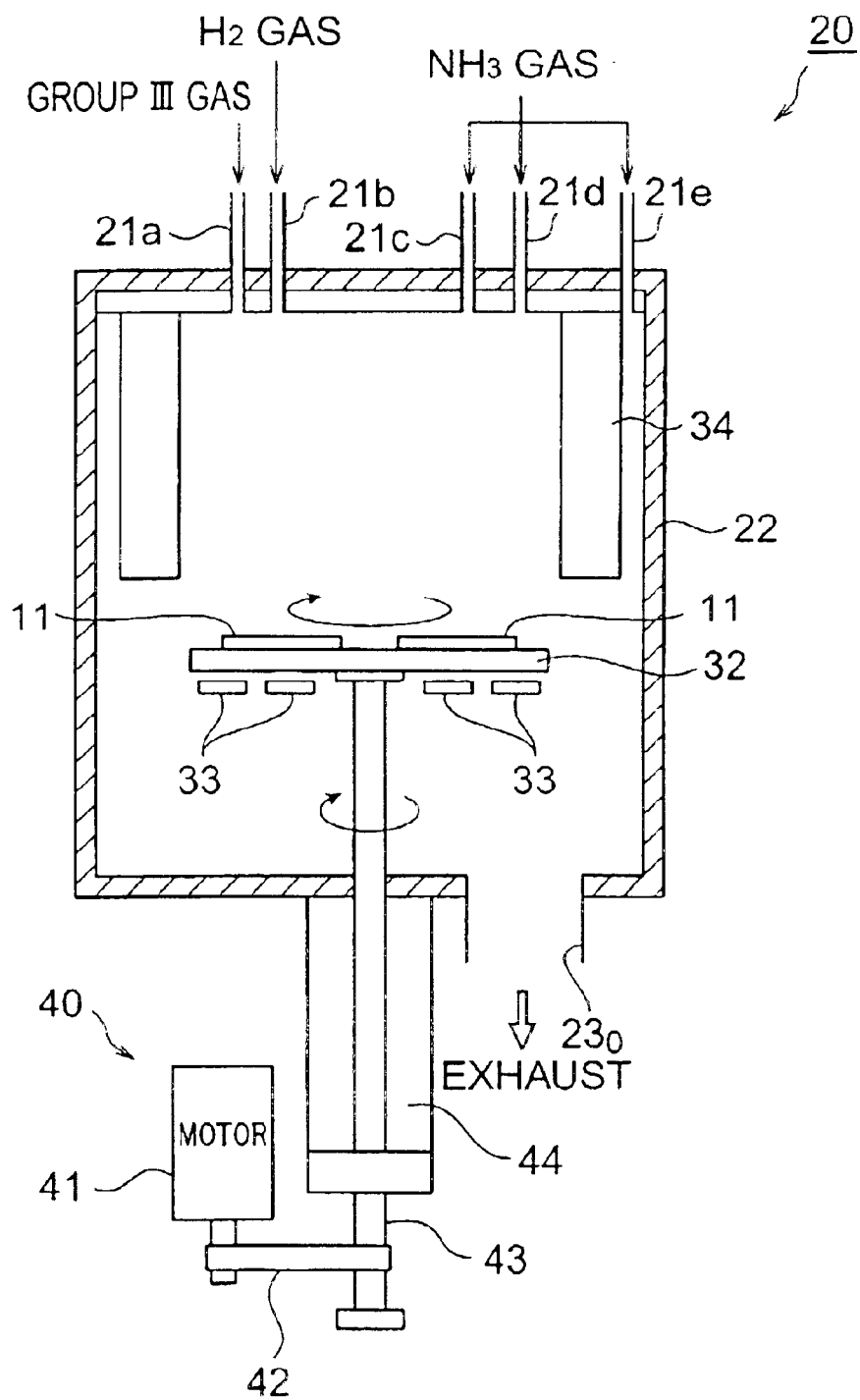
FIG. 5 is a schematic view of a growth furnace in an OMVPE apparatus used for an example of the present invention.

The GaN substrate 11 was heat-treated in an OMVPE apparatus under various conditions. Further, the GaN layer 12 was epitaxially grown within the same apparatus. As shown in FIG. 5, the OMVPE apparatus 20 used comprises a vertical growth furnace (reaction chamber) 22 constructed so as to jet out material gases at right angles with respect to the surface of the substrate 11. The growth furnace 22 is mainly constituted by material supply pipes 21a to 21e for supplying material gases and carrier gases, an exhaust pipe 23o for letting out the remainder gases after growth, a sample table 32 for placing a plurality of substrates 11, and heaters 33 for heating the sample table 32 from thereunder. A water-cooling jacket 34 is disposed in the upper part within the growth furnace 22, so as to be able to prevent the material gases from being heated to react with each other before reaching the substrate 11.

Disposed under the growth furnace 22 is a driving mechanism 40 for rotating the sample table 32. The driving mechanism 40 comprises a motor 41, and a rotary shaft 43 to which the rotation of the motor 41 is transmitted by way of a belt 42. The rotary shaft 43 is introduced into the growth furnace 22 by way of a magnetic fluid seal 44, such that its upper end is connected to the bottom face of the sample table 32. The magnetic fluid seal 44 disposed about the rotary shaft 43 tightly closes the through hole of the growth furnace 22 through which the rotary shaft 43 is inserted. The sample table 32, for which SiC-coated carbon can be used, is driven by the driving mechanism 40 at a high speed of about 1000 rpm, for example.

At the time of heat treatment, $NH_3$ was 11 slm, whereas $H_2$ or $N_2$ was 5 slm. The condition at the time of growing GaN was such that the substrate temperature was 1000° C., ammonia was 11 slm, $H_2$ was 5 slm, trimethyl gallium was 180 to 400 $\mu$mol/min, and the pressure was about 27 kPa (i.e., 200 Torr) As a comparative example, a GaN/sapphire substrate using sapphire as a substrate with a GaN layer grown beforehand was grown at the same time.

Table 1 shows the results of observation of the surface of the substrate 11 under an atomic force microscope after the heat treatment, whereas Table 2 shows the results of evaluation by the atomic force microscope and x-ray diffraction of samples having grown the GaN layer 12 by 2 $\mu$m. The x-ray diffraction was evaluated by the respective $\omega$ scan half width values of the (0002) reflection indicative of the c-axis fluctuation and the (10–11) reflection indicative of both of the fluctuations of c- and a-axes.

TABLE 1

| SUBSTRATE | HEAT TREATMENT CONDITION | SURFACE STATE | SURFACE ROUGHNESS (Rms) | EVALUATION |
| --- | --- | --- | --- | --- |
| GaN | NO HEAT TREATMENT | POLISHING DAMAGES | 1.0 nm | NG |
| GaN | $NH_3$ + $H_2$, 985° C., 5 min | NUMEROUS PROTRUSIONS | 0.78 nm | NG |
| GaN | $NH_3$ + $N_2$, 985° C., 15 min | POLISHING DAMAGES, PROTRUSIONS | 1.1 nm | NG |
| GaN | $NH_3$ + $H_2$, 1000° C., 15 min | NUMEROUS PITS | 0.19 nm | NG |
| GaN | $NH_3$ + $H_2$, 1020° C., 5 min | POLISHING DAMAGES | 0.40 nm | NG |
| GaN | $NH_3$ + $H_2$, 1020° C., 10 min | FLAT | 0.19 nm | GOOD |
| GaN | $NH_3$ + $H_2$, 1020° C., 15 min | FLAT | 0.15 nm | GOOD |
| GaN | $NH_3$ + $H_2$, 1040° C., 15 min | FLAT | 0.13 nm | GOOD |

TABLE 2

| SUBSTRATE | HEAT TREATMENT CONDITION | SURFACE ROUGHNESS (Rms) | X-RAY DIFFRACTION HALF WIDTH (0002) | X-RAY DIFFRACTION HALF WIDTH (10–11) | EVALUATION |
| --- | --- | --- | --- | --- | --- |
| GaN | NO HEAT TREATMENT | 0.35 nm | 129 sec | 132 sec | NG |
| GaN | $NH_3$ + $N_2$, 1000° C., 15 min | 0.14 nm | 95 sec | 108 sec | NG |
| GaN | $NH_3$ + $H_2$, 1000° C., 5 min | NO MEASUREMENT | 159 sec | 76 sec | NG |
| GaN | $NH_3$ + $H_2$, 1000° C., 15 min | 0.22 nm | 88 sec | 64 sec | NG |
| GaN | $NH_3$ + $H_2$, 1020° C., 10 min | 0.14 nm | 91 sec | 45 sec | GOOD |
| GaN | $NH_3$ + $H_2$, 1020° C., 15 min | 0.14 nm | 91 sec | 46 sec | GOOD |
| SAPPHIRE | $NH_3$ + $H_2$, 1000° C., 5 min | 0.58 nm | 429 sec | 674 sec | NG |

Table 1 indicates that the flatness and surface roughness are not improved upon heat treatment at a substrate temperature of less than 1020° C., whereas flat, favorable GaN single-crystal substrates with a low roughness can be made when heat treatment is carried out for at least 10 minutes at a substrate temperature of 1020° C. or higher in a mixed atmosphere of $NH_3$ and $H_2$. On the other hand, Table 2 indicates that both the surface roughness and x-ray diffraction are large in the comparative example on sapphire, but are remarkably improved when a GaN substrate is used. In particular, heat treatment for 10 minutes at a substrate temperature of 1020° C. or higher in a mixed atmosphere of $NH_3$ and $H_2$ can greatly improve the surface roughness and crystal axis fluctuation of the epitaxial layer.

Here, not only the heat treatment in the atmosphere of $NH_3+N_2$, but also the heat treatment in the atmosphere of $NH_3+H_2$ for less than 10 minutes or at a substrate temperature of less than 1020° C. is unfavorable, since the surface roughness (Rms) may exceed 0.2 nm or the x-ray diffraction half width may exceed 100 seconds. Though Table 2 does not measure the surface roughness (Rms) after the heat treatment, the heat treatment condition under which the surface roughness and crystal axis fluctuation of the epitaxial layer become sufficiently small coincides with the condition under which the surface roughness after heat treatment becomes 0.2 nm or less. Namely, for attaining a favorable epitaxial layer, a GaN single-crystal substrate having a surface roughness of 0.2 nm or less must be used.

When the threading dislocation density was determined from pit-like defects observed under an atomic force microscope in practice, it was about $10^8$ to $10^9$ $cm^{-2}$ in the epitaxial layer grown on the sapphire substrate, but was $10^6$ $cm^{-2}$ or less and thus was favorable in the epitaxial layer 12 grown on the GaN substrate 11 in many samples.

The present invention can reduce the surface roughness of the GaN single-crystal, thus being able to provide a GaN single-crystal substrate suitable for epitaxial growth. When a nitride type compound semiconductor layer is epitaxially grown on the GaN single-crystal substrate of the present invention, a nitride type compound semiconductor device exhibiting favorable characteristics can be formed.

What is claimed is:

1. A GaN single-crystal substrate having a polished surface flattened by heat treatment for at least 10 minutes at a substrate temperature of at least 1020° C. in a mixed gas atmosphere containing at least an $NH_3$ gas, and a nitride type compound semiconductor layer epitaxially grown on said GaN single-crystal substrate, and said nitride type compound semiconductor layer has an x-ray diffraction half width of 100 seconds or less.

2. A GaN single-crystal substrate having a polished surface flattened by heat treatment for at least 10 minutes at a substrate temperature of at least 1020° C. in a mixed gas atmosphere containing at least an $NH_3$ gas, and a nitride type compound semiconductor layer epitaxially grown on said GaN single-crystal substrate, and said nitride type compound semiconductor layer has a threading dislocation density of $1 \times 10^6$ $cm^{-2}$ or less.

3. A nitride type semiconductor device comprising a GaN single-crystal substrate having a polished surface flattened by heat treatment for at least 10 minutes at a substrate temperature of at least 1020° C. in a mixed gas atmosphere containing at least an $NH_3$ gas, and said substrate having an n-type conductivity; an n-type cladding layer, laminated on said substrate, the n-type cladding layer comprising $Al_xGa_{1-x}N$ (0<x<1); an active layer laminated on said cladding layer; a p-type cladding layer, laminated on said active layer, the p-type cladding layer comprising $Al_xGa_{1-x}N$ (0<x<1) and a p-type GaN layer laminated on said p-type cladding layer.

* * * * *